(12) United States Patent
Dausch

(10) Patent No.: US 8,710,717 B2
(45) Date of Patent: Apr. 29, 2014

(54) PIEZOELECTRIC ULTRASONIC TRANSDUCER APPARATUS

(75) Inventor: David Edward Dausch, Raleigh, NC (US)

(73) Assignee: Research Triangle Institute, Research Triangle Park, NC (US)

(*) Notice: Subject to any disclaimer, the term of this patent is extended or adjusted under 35 U.S.C. 154(b) by 0 days.

(21) Appl. No.: 13/575,536

(22) PCT Filed: Jan. 27, 2011

(86) PCT No.: PCT/US2011/022703
§ 371 (c)(1),
(2), (4) Date: Aug. 28, 2012

(87) PCT Pub. No.: WO2011/094393
PCT Pub. Date: Aug. 4, 2011

(65) Prior Publication Data
US 2012/0319535 A1    Dec. 20, 2012

Related U.S. Application Data

(60) Provisional application No. 61/299,514, filed on Jan. 29, 2010.

(51) Int. Cl.
*H01L 41/09* (2006.01)
(52) U.S. Cl.
CPC ................................ *H01L 41/09* (2013.01)
USPC .......................................................... 310/334

(58) Field of Classification Search
USPC ........................................... 310/334; 367/181
See application file for complete search history.

(56) References Cited

U.S. PATENT DOCUMENTS 7,449,821 B2 * 11/2008 Dausch ......................... 310/364
2003/0102777 A1 * 6/2003 Kuniyasu et al. ............. 310/334

FOREIGN PATENT DOCUMENTS

WO    WO 2008/054395    5/2008

* cited by examiner

*Primary Examiner* — J. San Martin
(74) *Attorney, Agent, or Firm* — Womble Carlyle Sandridge & Rice, LLP

(57) ABSTRACT

Methods are provided for creating a metal or other electrically-conductive member extending from an air-backed cavity of a piezoelectric ultrasonic transducer (pMUT) apparatus defining such an air-backed cavity, through a substrate layer disposed adjacent to the transducer device of the pMUT device, and into electrically-conductive engagement with a first electrode of the pMUT device, such that the electrically-conductive member provides an electrically-conductive engagement between the first electrode and a conformal electrically-conductive layer deposited in the air-backed cavity of the pMUT device. Associated apparatuses are also provided.

8 Claims, 8 Drawing Sheets

Figure 3:
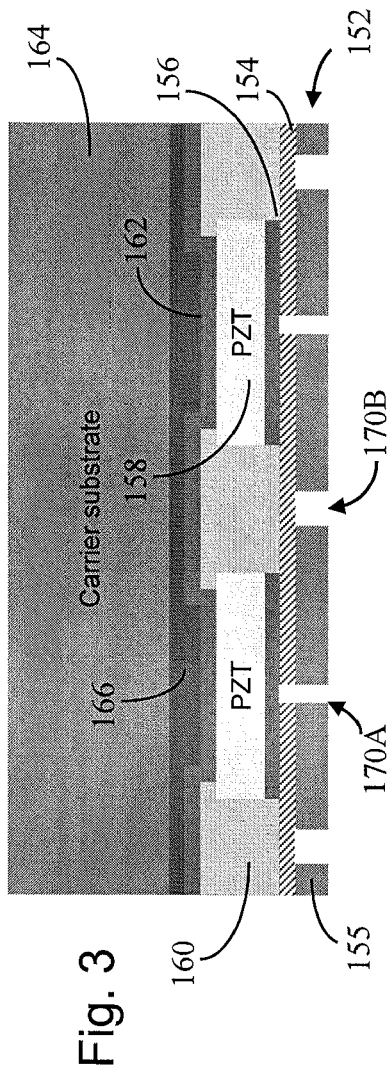

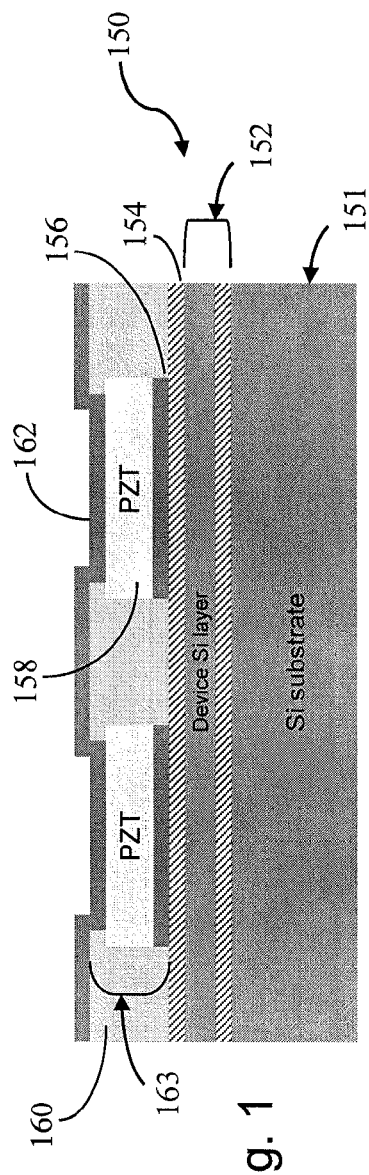
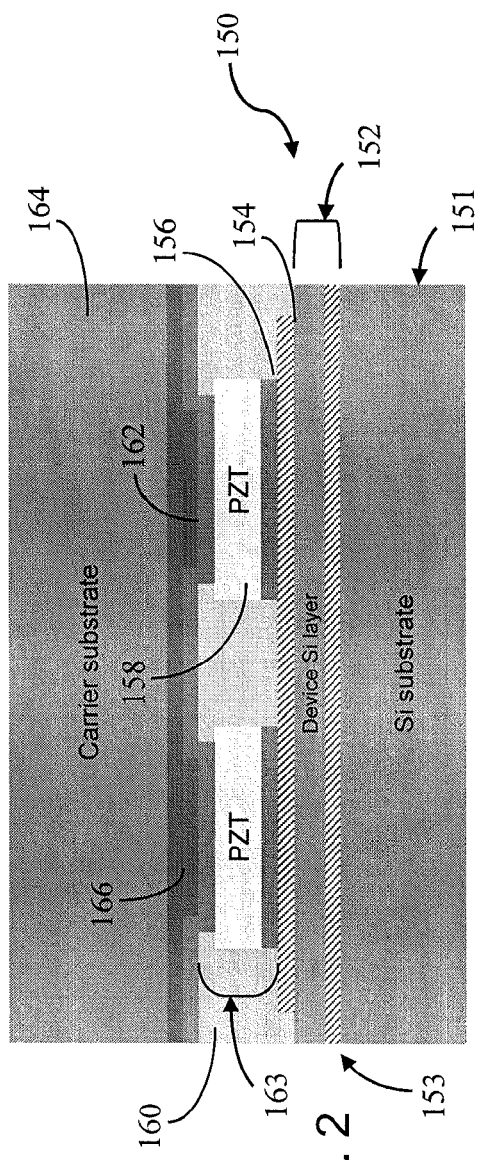
Fig. 1
Fig. 2

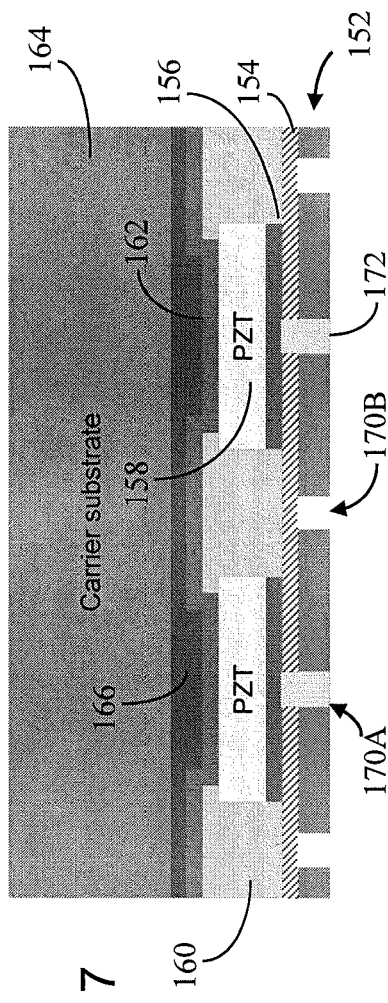
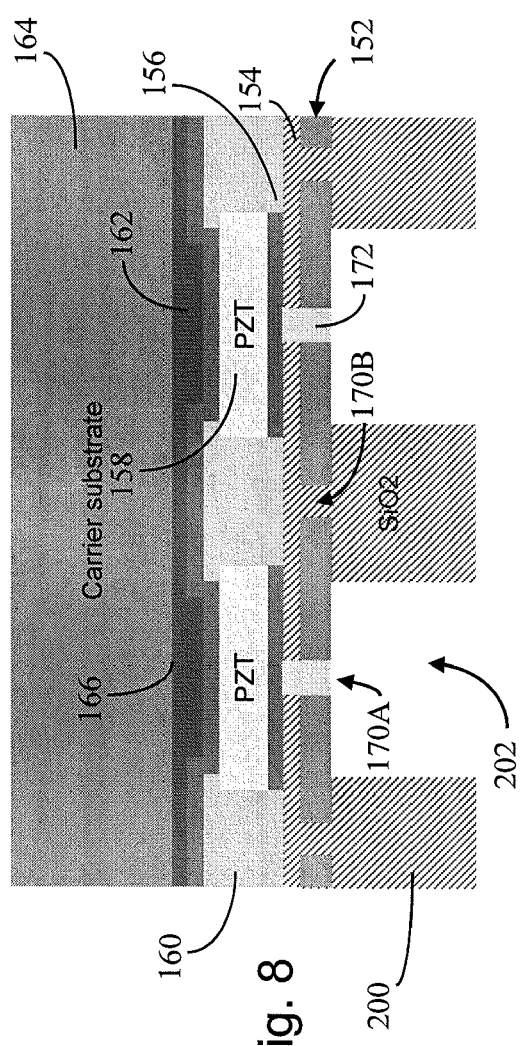

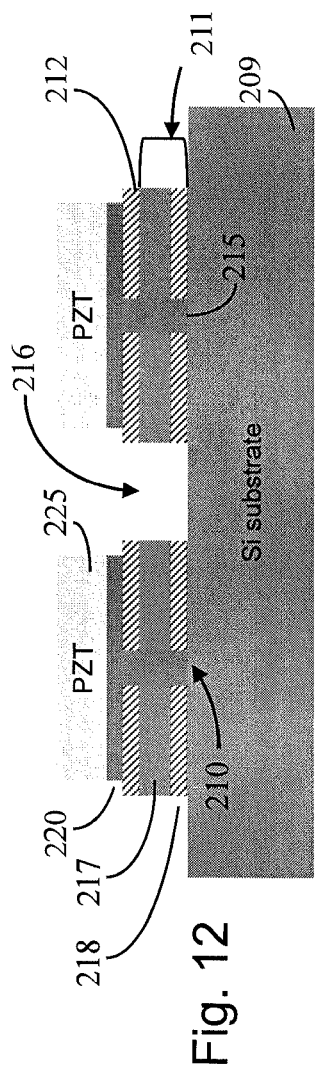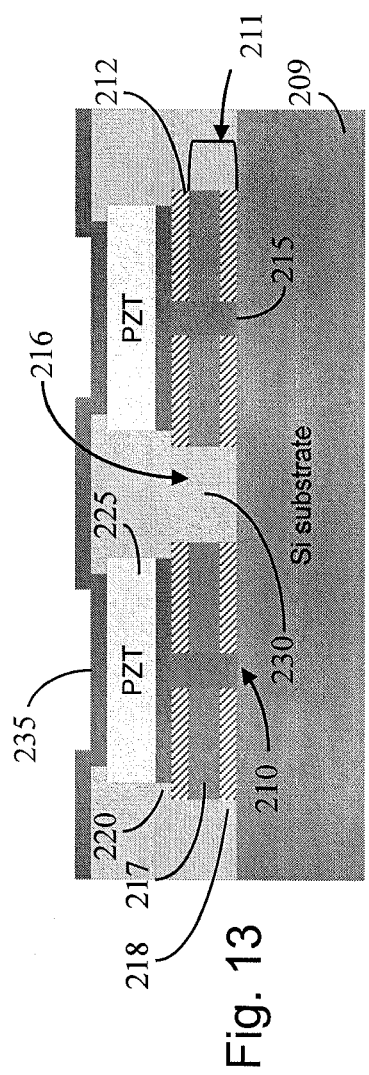
Fig. 12
Fig. 13

PIEZOELECTRIC ULTRASONIC TRANSDUCER APPARATUS

CROSS-REFERENCE TO RELATED APPLICATIONS

This application is a national stage filing under 35 U.S.C. 371 of PCT/US2011/022703 filed Jan. 27, 2011, which International Application was published by the International Bureau in English on Aug. 4, 2011, which claims priority to U.S. Provisional Application No. 61/299,514, filed on Jan. 29, 2010, which are both hereby incorporated herein in their entirety by reference.

FEDERALLY SPONSORED RESEARCH OR DEVELOPMENT

This invention was made with United States Government support under Contract No. R33 EB00566 awarded by National Institutes of Health (NIH). The United States Government has certain rights in the invention.

BACKGROUND OF THE DISCLOSURE

1. Field of the Disclosure

Aspects of the present disclosure relate to ultrasonic transducers, and, more particularly, to methods of forming a piezoelectric micromachined ultrasonic transducer defining an air-backed cavity, and associated apparatuses.

2. Description of Related Art

Some micromachined ultrasonic transducers (MUTs) may be configured, for example, as a piezoelectric micromachined ultrasonic transducer (pMUT) disclosed in U.S. Pat. No. 7,449,821 assigned to Research Triangle Institute, also the assignee of the present disclosure, which is also incorporated herein in its entirety by reference.

The formation of pMUT device, such as the pMUT device defining an air-backed cavity as disclosed in U.S. Pat. No. 7,449,821, may involve the formation of an electrically-conductive connection between the first electrode (i.e., the bottom electrode) of the transducer device, wherein the first electrode is disposed within the air-backed cavity of the pMUT device, and the conformal metal layer(s) applied to the air-backed cavity for providing subsequent connectivity, for example, to an integrated circuit ("IC") or a flex cable. In this regard, some prior art methods involved, for example, deposition of a conformal metal layer in the air-backed cavity of the pMUT in direct contact with the first/bottom electrode (see, e.g., FIG. 7A of U.S. Pat. No. 7,449,821). In another example, the conformal metal layer is deposited in a via formed in a dielectric film formed to expose the first/bottom electrode (see, e.g., FIG. 7B of U.S. Pat. No. 7,449,821). In yet another example, involving a silicon-on-insulator (SOI) substrate, the conformal metal layer is deposited in a via extending to immediately adjacent the transducer device (see, e.g., FIGS. 14 and 15 of U.S. Pat. No. 7,449,821). However, the formation of such vias (i.e., by etching) according to these exemplary prior art methods may be difficult due to, for example, the first/bottom electrode and/or the dielectric film being relatively thin, and thus providing an insufficient etch stop layer.

In other prior art methods, a device substrate may remain engaged with the pMUT device to provide a fixed thickness member for controlling the resonance frequency of the pMUT device. In such instances, an electrically-conductive connection between the first electrode and the conformal metal layer is formed through either a doped silicon layer (see, e.g., FIG. 7 of WO 2008/054395 A1, also assigned to Research Triangle Institute, wherein WO 2008/054395 A1 is also incorporated herein in its entirety by reference) or by a plug deposited in a via etched from the front side of the wafer into the silicon layer next to the piezoelectric (PZT) element (see, e.g., FIG. 14 of U.S. Pat. No. 7,449,821). However, such electrically-conductive connections may, in some instances, implement a lesser desirable conductor (i.e., doped silicon) connecting the first/bottom electrode to the conformal metal layer deposited in the via. More particularly, the doped silicon layer may demonstrate reasonable conductivity at high electric field levels, though the conductivity thereof may less desirably be nonlinear and markedly decrease at low field levels due to diode-like behavior in the doped silicon layer. In other instances, such electrically-conductive connections may involve contact between the first/bottom electrode and the conformal metal layer deposited in the via about a corner of the via (i.e., where the sidewall of the via meets the bottom or end wall of the via) and/or along a sidewall of the via. In such instances, it may be difficult to connect the conformal metal layer to the metal extending to the first/bottom electrode, since the sidewalls and/or corners of the vias may be rough or incompletely etched, thus possibly resulting in poor or inconsistent electrically-conductive engagement between the first/bottom electrode and the conformal metal layer.

Figure 15:
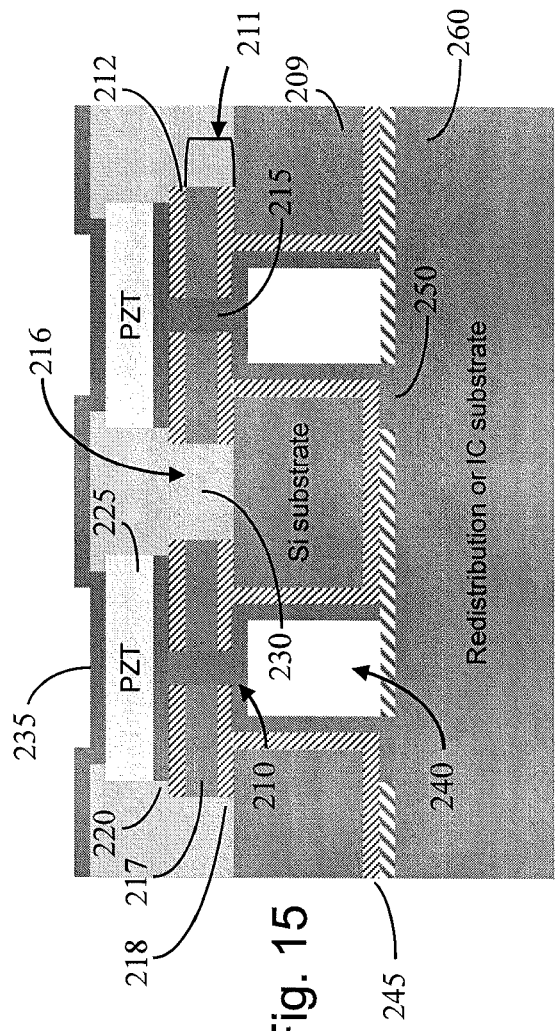

Another aspects of some prior art methods is that the element forming the electrically-conductive connection between the first electrode and the conformal metal layer may be formed about one of the lateral edges of the pMUT device (see, for example, FIG. 15 of U.S. Pat. No. 7,449,821). In such instances, mechanical flexure of the actuated pMUT device may initiate or accelerate fatigue of the engagement between the electrically-conductive connection element and conformal conductive layer within the second via, for instance, due to stress concentrations about the sidewall/endwall edge of the second via. Such fatigue could result in failure of the electrically-conductive engagement therebetween and would thus create an open circuit condition between the first/bottom electrode of the pMUT device and the IC, flex cable or redistribution substrate engaged therewith. Further, having a different material (i.e., a metal) disposed about a lateral edge of the membrane of the pMUT device for providing the electrical connection could change the boundary condition for membrane flexing and thus affect the frequency and/or vibrational mode (i.e., the fundamental or harmonic mode) of the pMUT device, thereby adversely affecting the acoustic signals generated by the pMUT device.

Thus, there exists a need in the ultrasonic transducer art, particularly with respect to a piezoelectric micromachined ultrasound transducer ("pMUT") having an air-backed cavity, for improved methods of forming an electrically-conductive connection between the first electrode (i.e., the bottom electrode) of the transducer device, the first electrode being disposed within an air-backed cavity of the pMUT device, and the conformal metal layer(s) applied to the air-backed cavity for providing subsequent connectivity, for example, to an integrated circuit ("IC") or a flex cable.

BRIEF SUMMARY OF THE DISCLOSURE

The above and other needs are met by aspects of the present disclosure, wherein one such aspect relates to a method of forming a piezoelectric ultrasonic transducer apparatus. Such a method comprises forming a transducer device on a dielectric layer disposed on a device substrate, wherein the device substrate is further disposed on a primary substrate. The transducer device includes a first electrode disposed on the dielectric layer and a piezoelectric material disposed between the first electrode and a second electrode. A carrier substrate is then bonded to the second electrode of the transducer device, opposite to the first electrode, and the primary substrate is removed. The device substrate and the dielectric layer are then etched to define a first via extending to the first electrode, and a first conductive material is deposited to substantially fill the first via. A support member is engaged with the device substrate and the first conductive material, and the carrier substrate then removed from the transducer device. The support member is then etched to define a second via extending to the device substrate and the first conductive material. A second conductive material is subsequently deposited on the support member, the device substrate, and the first conductive material defining the second via, such that the second conductive material forms an electrically-conductive engagement with the first conductive material.

In one particular aspect, the step of engaging the support member further comprises bonding a support substrate to the device substrate and the first conductive material. An insulator material is then deposited on the support substrate, wherein the insulator material extends into the second via to the device substrate, after etching the support member to define the second via and before depositing the second conductive material.

In another particular aspect, the step of engaging the support member further comprises depositing an insulator material on the device substrate and the first conductive material.

Yet another aspect of the present disclosure provides a method of forming a piezoelectric ultrasonic transducer apparatus. Such a method comprises etching a device layer disposed on a substrate so as to define a first via extending to the substrate, and depositing a first conductive material to substantially fill the first via. A transducer device is then formed at least on the first conductive material, wherein the transducer device includes a first electrode disposed on the first conductive material, and a piezoelectric material disposed between the first electrode and a second electrode. The substrate is then etched to define a second via extending to the device layer and the first conductive material. An insulator material is deposited on the substrate, wherein the insulator material extends into the second via to the device layer. A second conductive material is then deposited on the insulator material, the device layer, and the first conductive material defining the second via, such that the second conductive material forms an electrically-conductive engagement with the first conductive material.

Still another aspect of the present disclosure provides a piezoelectric ultrasonic transducer apparatus, comprising a transducer device disposed on a dielectric layer disposed on a device substrate. The transducer device includes a first electrode disposed on the dielectric layer and a piezoelectric material disposed between the first electrode and a second electrode. The device substrate and the dielectric layer are configured to define a first via extending to the first electrode. A first conductive material is configured to substantially fill the first via. A support member is engaged with the device substrate and forms a sidewall defining a second via extending to and exposing the device substrate and the first conductive material. The exposed device substrate further defines a second via end wall, and the first conductive material is disposed with respect to the second via end wall away from the sidewall. In some instances, the first conductive material is medially disposed with respect to the second via end wall away from the sidewall. The apparatus may also comprise a second conductive material disposed on the support member, the device substrate, and the first conductive material defining the second via, wherein the second conductive material forms an electrically-conductive engagement with the first conductive material.

Aspects of the present disclosure thus address the identified needs and provide other advantages as otherwise detailed herein.

BRIEF DESCRIPTION OF THE SEVERAL VIEWS OF THE DRAWING(S)

Figure 9:
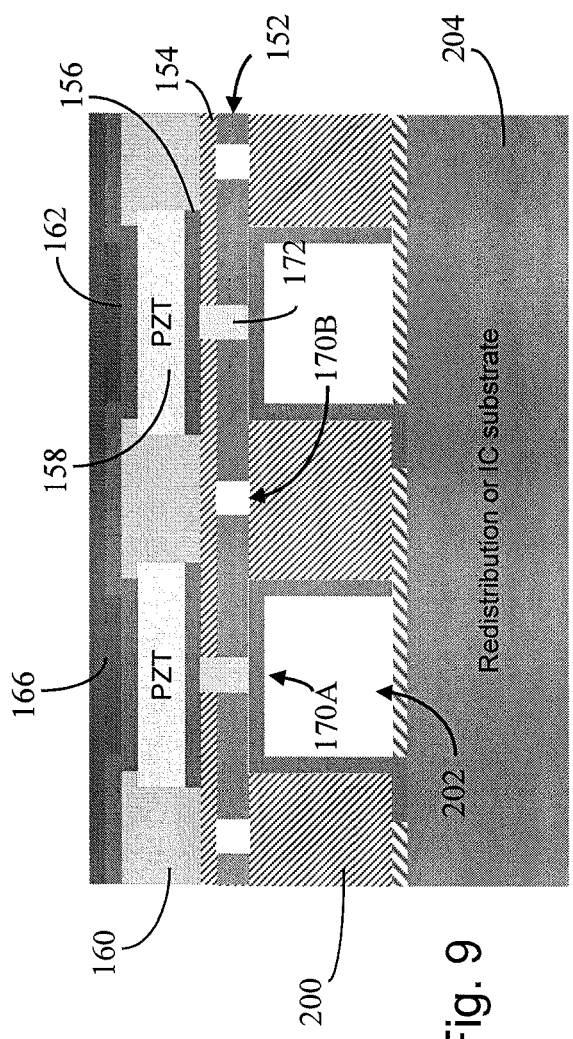

Having thus described the disclosure in general terms, reference will now be made to the accompanying drawings, which are not necessarily drawn to scale, and wherein:

FIGS. 1-6 schematically illustrate a wafer bonding method of forming a piezoelectric micromachined ultrasonic transducer apparatus, according to one aspect of the disclosure;

FIGS. 7-9 schematically illustrate an oxide growth method of forming a piezoelectric micromachined ultrasonic transducer apparatus, according to another aspect of the disclosure; and FIGS. 10-15 schematically illustrate an initial electrically-conductive interconnect formation method for forming a piezoelectric micromachined ultrasonic transducer apparatus, according to yet another aspect of the disclosure.

DETAILED DESCRIPTION OF THE DISCLOSURE

The present disclosure now will be described more fully hereinafter with reference to the accompanying drawings, in which some, but not all aspects of the disclosure are shown. Indeed, the disclosure may be embodied in many different forms and should not be construed as limited to the aspects set forth herein; rather, these aspects are provided so that this disclosure will satisfy applicable legal requirements. Like numbers refer to like elements throughout.

Aspects of the present disclosure are generally directed to methods for creating a metal or other electrically-conductive member extending from an air-backed cavity of a pMUT, through a substrate (i.e., SOI) layer disposed adjacent to the transducer device of the pMUT, and into electrically-conductive contact with the first/bottom electrode, such that the electrically-conductive member provides an improved electrically-conductive engagement between the first/bottom electrode and a conformal metal layer deposited in the air-backed cavity of the pMUT device defining the same.

According to various aspects of the present disclosure, a wafer bonding method and an oxide growth method are provided. Such methods first involve fabricating particular layers of one or more exemplary pMUT devices. One such example of a plurality of pMUT devices 150 (i.e., a pMUT "wafer") is shown FIG. 1. As shown, the wafer bonding and oxide growth methods may initially involve a primary substrate 151 having a silicon-on-insulator (SOI) device substrate 152 formed thereon. In other instances (not shown), the device substrate 152 may comprise silicon. In some instances, a dielectric material such as, for example, a thermal $SiO_2$ (thermal oxide) dielectric layer 154 may be deposited on the device substrate 152. A first electrode layer 156 (otherwise referred to herein as a "bottom" electrode) comprising, for instance, a Ti/Pt material, may then be deposited on the dielectric layer 154. A piezoelectric material layer 158 such as, for example, a piezoelectric (PZT) film, is subsequently deposited on the first electrode layer 156, and the piezoelectric material layer 158 and first electrode layer 156 are then configured to form the footprints of the transducer devices. An interlayer dielectric 160 such as, for instance a benzocyclobutene (BCB) material, is then deposited and processed to separate the transducer devices. In some aspects, the piezoelectric material layer 158 may be configured such that the previously-deposited first electrode layer 156 extends laterally outward with respect thereto. In such aspects, the subsequently deposited BCB material may also be deposited on the first electrode layer 156. A second electrode layer 162 (otherwise referred to herein as a "top" electrode) comprising, for instance, a Ti/Au material, is then deposited on the piezoelectric material layer 158 and the interlayer dielectric 160. The first electrode layer 156, the piezoelectric material layer 158, and the second electrode layer 162 thus cooperate to form the transducer device 163 (see, e.g., FIGS. 1 and 2). In some aspects, the second electrode layer 162 may comprise a ground electrode, while the first electrode layer 156 may comprise a signal electrode. In aspects involving the first electrode layer 156 extending laterally outward of the piezoelectric material layer 158, the BCB material may also be disposed between the first and second electrode layers 156, 162. Such a configuration (i.e., electrode(s) extending laterally outward of the piezoelectric material) may, for example, prevent electrical short circuits about the edges of the piezoelectric material 158 by providing an isolation/insulation layer between the first and second electrodes 156, 162.

Piezoelectric materials that can be implemented in the piezoelectric material layer 158 include, for example, ceramics including ZnO, AlN, LiNbO$_4$, lead antimony stannate, lead magnesium tantalate, lead nickel tantalate, titanates, tungstates, zirconates, or niobates of lead, barium, bismuth, or strontium, including lead zirconate titanate (Pb(Zr$_x$Ti$_{1-x}$)O$_3$ (PZT)), lead lanthanum zirconate titanate (PLZT), lead niobium zirconate titanate (PNZT), BaTiO$_3$, SrTiO$_3$, lead magnesium niobate, lead nickel niobate, lead manganese niobate, lead zinc niobate, lead titanate. Piezoelectric polymer materials such as polyvinylidene fluoride (PVDF), polyvinylidene fluoride-trifluoroethylene (PVDF-TrFE), or polyvinylidene fluoride-tetrafluoroethylene (PVDF-TFE) can also be used.

In the aspect of the present disclosure directed to the wafer bonding method, as shown in FIG. 2, a carrier substrate 164 is bonded to the top surface (i.e., the second electrode layer 162) of the pMUT wafer 150 using, for example, an epoxy, an adhesive tape, or other adhesive material 166 that can be removed in later processing. As shown in FIG. 3, the primary substrate 151 is then removed from the device substrate 152. One skilled in the art will appreciate that the removal of the primary substrate can be accomplished in various manners. For example, if the device substrate 152 is an SOI substrate, the primary substrate 151 can be removed by etching the buried oxide layer 153 of the SOI device substrate 152 using, for example, an HF acid. In order to avoid etching of the thermal oxide dielectric layer 154 engaged with the first electrode layer 156, the dielectric layer 154 may be patterned about the lateral edges of the wafer such that the subsequently-deposited interlayer dielectric 160 covers the lateral edges of the dielectric layer 154 and prevents etching by exposure to the HF acid used to remove the primary substrate 151.

If the device substrate 152 is an SOI substrate, the primary substrate 151 may be removed by back-grinding and the device substrate 152 then polished to remove the buried oxide layer 153 (FIG. 2), and to leave a particular thickness of silicon layer 155 (see, e.g., FIG. 3) for supporting the transducer device. A suitable thickness of the silicon component 155 may be, for instance, between about 2 μm and about 15 μm. If the device substrate 152 is a bare silicon wafer, the remaining suitable thickness of the remaining portion of the silicon wafer may, in some instances, be difficult to control precisely, for example, to about ±0.5 μm in thickness variation. However, a device substrate 152 comprising a bare silicon wafer may be back-grinded or subject to a chemical mechanical polishing (CMP) process to provide as uniform a thickness as possible in the remaining silicon wafer. In one particular aspect implementing an SOI device substrate 152, the primary substrate 151 may first be back-grinded to a thickness of less than about 50 μm. The remaining silicon portion of the primary substrate 151 can then be etched, for example, using a silicon etch process while implementing silicon oxide as an etch stop. The buried oxide layer 153 could then be subsequently removed, for instance, by HF or RIE (Reactive Ion Etch) etching. The remaining silicon layer 155 could then be more readily controlled with respect to the thickness thereof so as to provide consistency of the pMUT devices across the wafer 150.

Further, as shown in FIG. 3, first vias 170A may then be formed, for example, by etching in a deep reactive ion etching (DRIE) process, in the remaining silicon portion of the device substrate 152. In one aspect, particular first vias 170A may be formed in the remaining device substrate 152 so as to extend through the dielectric (thermal oxide) layer 154 to the first/bottom electrode layer 156 of the transducer device 163. Isolation vias 170B may also be formed laterally between adjacent pMUT devices, with such isolation vias 170B extending through the remaining device substrate 152, but not through the dielectric layer 154. Such isolation vias 170B may, in some aspects, facilitate an electrical isolation function between signal (first/bottom) electrodes of adjacent pMUT devices. In other instances, the isolation vias 170B may be formed to extend through the dielectric layer 154 to the interlayer dielectric 160, or even into the interlayer dielectric 160, so as to provide, for example, an acoustic isolation function between adjacent pMUT devices.

Figure 4:
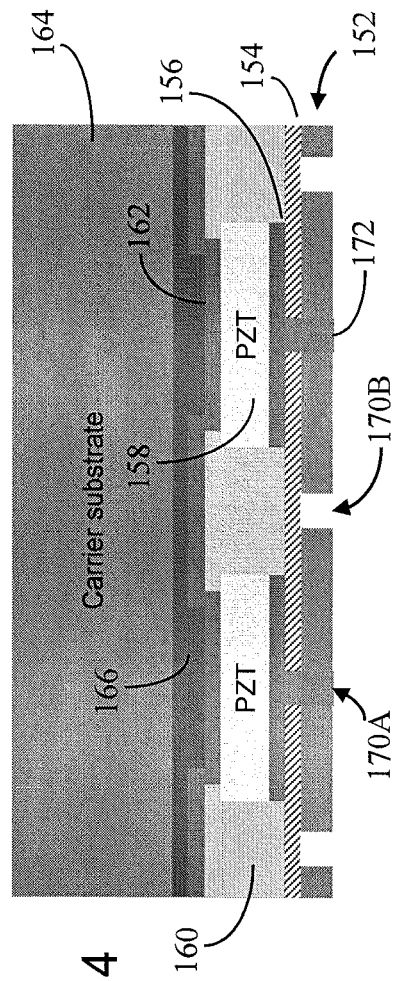

As shown in FIG. 4, the first vias 170A can then be filled with a first conductive material 172 (i.e., by deposition of a layer of metal or other conductive material) such as for example, Cu, in a sputtering, chemical vapor deposition, and/or plating process. The first conductive material 172 is configured to substantially fill the first via 170A and to form an electrically-conductive engagement with the first/bottom electrode layer 156. The first conductive material 172 may thus provide an electrically-conductive element extending from the first/bottom electrode layer 156 through the remaining silicon portion of the device substrate 152. The isolation vias 170B that are not filled by the first conductive layer 172 may provide, for example, an isolation trench around each pMUT device so as to prevent electrical conductivity between pMUT devices, as well as to prevent acoustic cross-talk between pMUT devices. In some aspects, the isolation vias 170B may remain unfilled (i.e., to contain air) or may be filled with a polymeric material or other dielectric material (e.g., BCB). In some instances, it may be advantageous for such a polymeric material to have a relatively high acoustic absorption. In other instances, if the remaining silicon portion of the device substrate 152 is relatively highly resistive (i.e., intrinsic silicon), or if the sidewalls defining the first vias 170A were covered with an insulator, such as an insulating polymer or a silicon oxide layer, prior to deposition of first conductive material 172 in the first vias 170A, then the additional isolation vias 170B may not be necessary for electrical isolation between adjacent pMUT devices.

Figure 5:
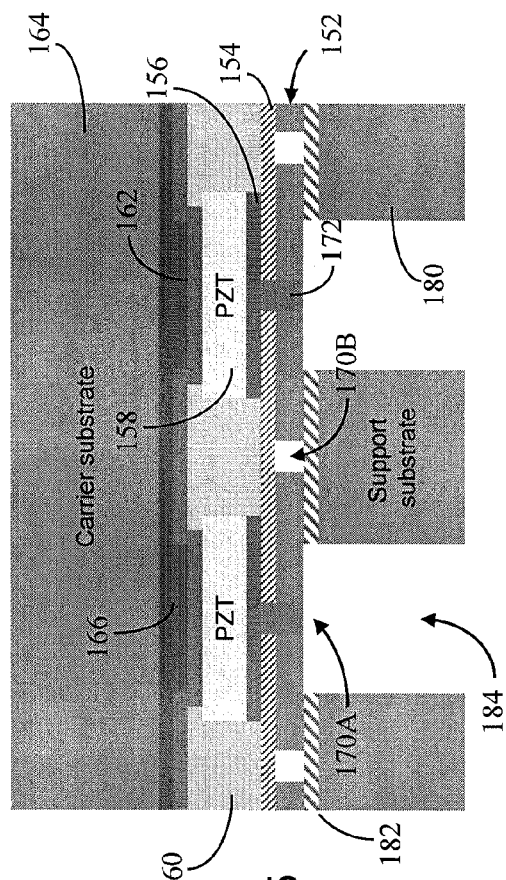

As shown in FIG. 5, a support member 180 (i.e., a silicon substrate) may be engaged, for example, by bonding, to the remaining silicon portion of the device substrate 152 and the first conductive material 172 using, for instance, an epoxy or other adhesive layer 182. Second vias 184 may then be formed in the support member 180, for example, using an etching process (i.e., DRIE), with the second vias 184 extending through the adhesive layer 182 to expose the remaining silicon portion of the device substrate 152 and the first conductive material 172 (the exposed remaining silicon portion of the device substrate 152/the first conductive material 172 thereby forming an end wall of the second via 184). In some aspects, a low temperature bonding material may be suitable as the adhesive layer 182 for preventing detrimental effects to other layers of the pMUT wafer during the etching process of the support member 180 for forming the second vias 184. In other aspects, the adhesive layer 182 could comprise a photoimageable epoxy, such as SU-8, which is patterned to define laterally extending openings corresponding to the footprint of the pMUT devices, prior to the adhesive layer 182 adhering the support member 180 to the remaining silicon portion of the device substrate 152. In this manner, the second vias 184 may be etched in the support substrate 180 (and the conformal insulator material 185 deposited thereon, as addressed hereinbelow) prior to the support substrate 180 being bonded to the remaining silicon portion of the device substrate 152. When suitably aligned, the support member 180 would then be adhered to the remaining silicon portion of the device substrate 152 in areas about the second vias 184 and thus the footprints of the respective pMUT devices. The carrier substrate 164 may then be removed from the second electrode layer 162.

Figure 6:
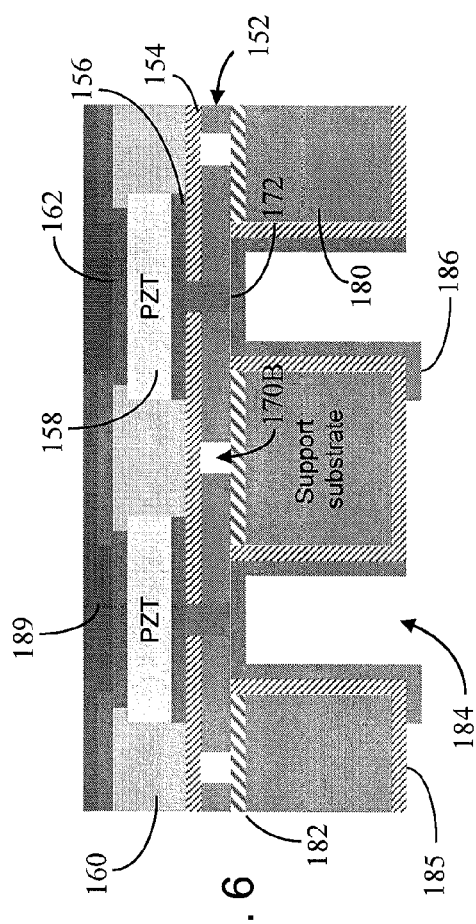

As shown in FIG. 6, the support member 180, including the portions thereof defining the second vias 184 (i.e., the "sidewalls") may then have deposited thereon a conformal insulator material 185 extending about the exposed surfaces of the support member and extending into the second vias 184 to the remaining silicon portion of the device substrate 152 and/or into engagement with the adhesive layer 182 disposed between the support member 180 and the remaining silicon portion of the device substrate 152. A second conductive material 186, such as a metal, may then be deposited in the second vias 184 so as to conform to the remaining silicon portion of the device substrate 152 and the first conductive material 172 forming the end wall of the second via 184, as well as the insulator material 185 applied to the support member 180/adhesive layer 182, all defining the second vias 184, with at least a portion of the second conductive material 186 extending outwardly of the respective second via 184. The second conductive material 186, thus deposited, is configured to form an electrically-conductive engagement directly with the portion of the first conductive material 172 extending through the remaining silicon portion of the device substrate 152. A conformal layer 189 comprising a polymeric material such as, for example, parylene or other suitable polymer, may also be deposited on the second electrode layer 162 in order to provide, for instance, device protection and moisture barrier functions.

Once formed, the pMUT devices included on the wafer, as shown in FIG. 6, may be bonded to an IC, flex cable, or redistribution element (see, e.g., FIG. 9), for example, using solder bumps or other suitable electrically-conductive connection provisions, to provide an electrically-conductive engagement between the second conductive material 186 extending from a second via 184 of a particular pMUT device and the IC, flex cable, or redistribution element (or other external device). Such a wafer bonding approach according to aspects of the disclosure thus provides a direct electrically-conductive engagement between the second conductive material 186 deposited in the second via 184 \ (i.e., via metallization) to the first/bottom electrode layer 156 via the first conductive material 172. In particular aspects, the first conductive material 172 in the second via 184 is surrounded by the remaining silicon portion of the device substrate 152 (i.e., away from the sidewall of the second via 184) and, in some instances, centrally within the second via 184 (i.e., medially disposed with respect to the second via end wall). Such a configuration may, in some instances, facilitate improved electrically-conductive engagement between the first and second conductive materials 172, 186, since removal of portions of the insulator material 185 within the second vias 184 may be more completely removed from the center of the second via 184 than on the sidewalls or in the corners thereof. One skilled in the art will appreciate that the first conductive material 172 may be configured as a single "plug" forming the "plug in center" aspect, or may be configured as a plurality of smaller "plugs." One possible benefit of the latter configuration may be that the resonant properties of the remaining silicon portion of the device substrate 152 may be less affected by a plurality of smaller discontinuities as compared to a single larger discontinuity.

As a further aspect of the present disclosure, the first conductive material 172 may also be configured to be medially disposed with respect to the pMUT device when forming the electrically-conductive engagement with the first/bottom electrode thereof, as compared, for example, to being disposed about the lateral edges of the pMUT device or the first/bottom electrode thereof (and, therefore, being disposed adjacent to the sidewall of the second via). Such a "medially disposed" configuration may, for example, desirably reduce fatigue between the first/bottom electrode and the first conductive material and/or between the first conductive material and the second conductive material (since the first conductive material would form a "plug in center" aspect with respect to the second via). Such a "plug in center" aspect could also serve to reduce vibrational artifacts, for example, by desirably reducing or eliminating acoustic discontinuity about the lateral edges of the flexing membrane of the pMUT device.

In some aspects, the support member 180 may also be thinned, with respect to that shown in FIG. 5, prior to etching the second vias 184. In such an instance, with the carrier substrate 164 still engaged, the support member 180 may be thinned, for example, by back-grinding or CMP to a thickness of between about 10 μm and about 150 μm, which may allow smaller-sized second vias 184 to be etched in the support member 180. Implementing a full thickness (~400 μm) support member 180 may result in minimal dimension second via 184, that can be practically etched and metallized as shown in FIG. 6, of about 50 μm, thus yielding an aspect ratio of 8:1 and possibly limiting the frequency response of the associated pMUT device(s) to less than about 20 MHz. For higher frequency response pMUT device(s), smaller second vias and transducer devices may be required. For example, a pMUT device having a frequency response of about 40 MHz may require a pMUT device footprint of approximately 20 μm which may, in turn require a thinned support member 180 of no more than about 160 μm in thickness, and preferably less than about 100 μm in thickness. A higher frequency response may, in some instances, provide improved resolution. In configurations involving a thinned support member 180, the processing steps subsequent to the thinning process may be accomplished with the carrier substrate 164 still engaged.

In the aspect of the present disclosure directed to the oxide growth method, the support member may comprise a relatively thick oxide (i.e., $SiO_2$) layer 200 (i.e., as a "substrate"). Accordingly, as shown in FIG. 7, the first via 170A associated with each pMUT device is first substantially filled with the first conductive material 172. However, with respect to these aspects of the present disclosure, the first conductive material 172, such as a metal, is selected to withstand SiO$_2$ growth temperatures (for example, at least between about 250° C. and about 350° C.), without oxidation. In one example, the first conductive material 172 may be gold or platinum deposited, for instance, by a sputtering and/or a plating process. Subsequently, as shown in FIG. 8, the oxide layer 200 may be deposited, for example, by PECVD to a thickness of between about 10 μm and about 20 μm. In some instances, the oxide layer 200 may be deposited so as to substantially fill the isolation vias 170B. Second vias 202 are then etched in the oxide layer 200, for example, using a deep anisotropic oxide etch (AOE) to achieve vertical sidewalls. The second vias 202, as previously disclosed, extend through the oxide layer 200 to the remaining silicon portion of the device substrate 152 and the first conductive material 172 (i.e., the end wall of the second via 202). The oxide layer 200 may thus provide a support member that is electrically insulating (i.e., as compared to a silicon support member). The second conductive material 186 may then be deposited directly on the oxide layer 200 and appropriately patterned to isolate the pMUT devices. Such a method may, in some instances, eliminate an additional conformal dielectric isolation layer in the second vias 202 prior to deposition of the second conductive material 186. In some aspects, a redistribution substrate 204 can be attached, such as by bonding, to the oxide layer 200/second conductive material 186, as shown in FIG. 9. If the redistribution substrate 204 is thinned, the carrier substrate 164 may have to remain engaged until that process is completed.

Yet another aspect of the present disclosure is directed to a method involving formation of electrically-conductive (i.e., metal) "plugs" extending through a via in the silicon layer of an SOI substrate, or through a via in a silicon dioxide layer on a silicon substrate, prior to formation of the pMUT devices, so as to provide a direct electrically-conductive engagement between the first/bottom electrode layer and the plug extending through the via. Direct metal to metal contact, such as direct contact between the first/bottom electrode layer and the plug, may thus advantageously provide a low-resistance electrically-conductive engagement as compared to the doped silicon layer.

Figure 10:
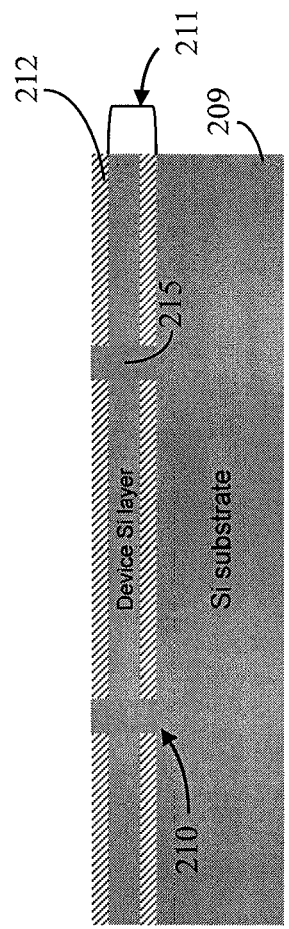
Figure 11:
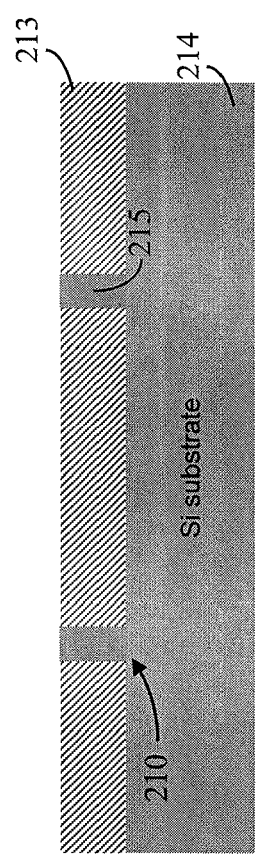

As shown in FIG. 10, first vias 210 are formed, for example, by etching, in the device silicon layer of a SOI device substrate 211 (with a thermal SiO$_2$ layer 212 grown on the surface) formed on a primary substrate 209, or a thick SiO$_2$ layer 213 on a silicon substrate 214 (FIG. 11). In some instances, the first vias 210 may be between about 2 μm and about 15 μm deep, extending to the primary substrate 209 or the silicon substrate 214, and may each have a diameter of between about 3 μm and about 10 μm. The first vias 210 may further be formed by etching, for example, by deep silicon RIE (DRIE) or anisotropic oxide RIE (AOE) to provide substantially vertical sidewalls defining the first vias 210. In the aspect involving the SOI substrate, it may be desirable to perform, for example, a thermal oxidation process following formation of the first vias 210 in order to grow the thermal SiO$_2$ on the sidewalls of the first vias 210 for providing electrical isolation in the first vias 210. A first conductive layer 215 is then deposited so as to substantially fill the first vias 210 with an electrically-conductive material such as a metal (i.e., by performing a sputtering, e-beam evaporation or CVD process to form a seed layer, followed by an electroplating process). Because one of the components of the transducer device is a piezoelectric material (e.g., PZT annealed at 700° C.), a high temperature metal may be desirable, such as Pt with a Ti adhesion layer. Such a material may also desirably be implemented as the first/bottom electrode layer 220 of the transducer device. Once the first conductive layer 215 is deposited, the deposition surface may be planarized, for example, using CMP, in order to remove excess plated metal from the thermal oxide layer 212 or the thick oxide layer 213, and provide a polished, flat surface of the first conductive layer 215 forming the "plug" for subsequent processing.

Following planarization, the component layers of the transducer device are formed as previously disclosed and shown in FIG. 12. More particularly, the component layers include a first/bottom electrode layer 220 comprising, for example, a Ti/Pt material deposited by an evaporation process. A piezoelectric material layer 225 such as, for example, a PZT piezoelectric film, is then deposited using, for instance a spin coat/annealing process. As an optional step (as shown, for example, in FIG. 12 for aspects implementing an SOI substrate), isolation trenches or vias 216 may be etched through the piezoelectric material layer 225, the first/bottom electrode layer 220, the thermal oxide layer 212, the device silicon layer 217, and the buried oxide layer 218 to electrically and acoustically isolate the transducer devices/pMUT elements in the array from each other. In some aspects, the piezoelectric material layer 225 may be etched or otherwise configured such that the first/bottom electrode layer 220 extends laterally outward with respect thereto. As shown in FIG. 13, an interlayer dielectric 230 (i.e., BCB deposited using a spin coat process) is then deposited to provide electrical isolation between the first/bottom electrode layer 220 and a second/top electrode layer 235 deposited on the interlayer dielectric 230/piezoelectric material layer 225. In aspects involving the first/bottom electrode layer 220 extending laterally outward of the piezoelectric material layer 225, the BCB material may also be deposited on the first/bottom electrode layer 220, and may thus be disposed between the first/bottom and second/top electrode layers 220, 235. Such a configuration (i.e., electrode(s) extending laterally outward of the piezoelectric material) may, for example, prevent electrical short circuits about the edges of the piezoelectric material 225 by providing an isolation/insulation layer between the first and second electrodes 220, 235. In some instances, the interlayer dielectric 30 may also provide an acoustic attenuation function between the transducer devices/pMUT elements, particularly in instances where isolation trenches 216 are formed (i.e., the interlayer dielectric 230 in the isolation trenches forms a polymer-filled kerf between the transducer devices/pMUT elements, similar to standard ceramic transducers in which piezoelectric (PZT) elements are diced with a saw and the dicing kerf is filled with a polymer for acoustic isolation), as previously disclosed. The second/top electrode layer 235 may comprise, for example, Ti/Au deposited in an evaporation process. The first/bottom electrode layer 220 may serve as a signal electrode, while the second/top electrode layer serves as a ground electrode, for the transducer device.

Figure 14:
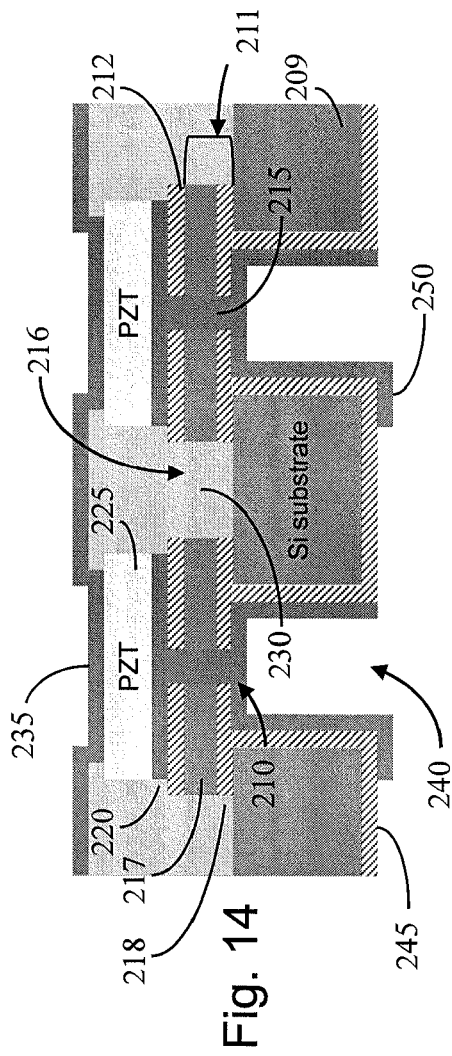

As shown in FIG. 14, the primary substrate 209 is then etched, for example, by DRIE (for substantially vertical sidewalls), to form second vias 240. The second vias 240 extend through the primary substrate 209 to the device substrate 211 (i.e., at least to the buried thermal oxide layer 218) to expose the first conductive layer 215 electrically engaged with the first/bottom electrode layer 220. The primary substrate 209, including the second vias 240, can then be coated with a dielectric layer 245 (extending into the second via 240 to the device substrate 211) comprising, for example, a polymer or oxide, such as parylene or TEOS SiO$_2$, to electrically isolate the primary substrate 209 defining the second vias 240. A second conductive material 250 comprising, for example, a metal such as Ti/Cu, may then be deposited on the dielectric layer 245 and into the second vias 240, for example, by a sputtering, CVD and/or plating process, with the second conductive material 250 forming an electrically-conductive engagement with the first conductive material 215, and thus to the first/bottom electrode 220, and with the second conductive material 250 otherwise extending outward of the second via 240.

Once formed, the pMUT devices included on the wafer, as shown in FIG. 14, may be bonded to an IC (e.g., a control IC such as amplifier or multiplexer), an interposer (e.g., silicon or flex cable), or redistribution element as shown in FIG. 15, for example, using solder bumps, gold stud bumps, anisotropic conductive epoxy, or other suitable electrically-conductive connection provisions, to provide an electrically-conductive engagement between the second conductive mater 250 extending from a second via 240 of a particular pMUT device and the IC, flex cable, or redistribution element 260.

The direct electrically-conductive engagement path between the second conductive material 250, the first conductive material 215, and the first/bottom electrode 220, thus provides an improved electrically-conductive connection between the pMUT device and the interposer, IC, or redistribution element 260 (or other external device). Such an aspect may be beneficial, in one particular instance, for ultrasonic transducer devices used in medical imaging. For such devices, a relatively large transmit voltage signal (e.g., between about 10V and about 100V) may be applied to the opposing electrodes to cause vibration of the pMUT membrane (the piezoelectric material layer) to generate and transmit acoustic pressure into the tissue being imaged. Acoustic reflections are then returned from the tissue, causing vibration of the pMUT membrane and generation of small receive voltage signals by the piezoelectric material layer (e.g., on the mV order or less). In instances of small receive voltage signals, improved electrically-conductive connection between the pMUT device and the interposer, IC, or redistribution element 260 could, for example, reduce signal losses (i.e., since nonlinear electrical conduction, high resistance, or poor electrical connection through the second via 240 may diminish or prevent some receive voltage signals from propagating to the interposer, IC, or redistribution element 260. For relatively large transmit voltage signals, poor conductivity could cause heat generation in the pMUT device; thus, an improved electrically-conductive connection could reduce heat generation by the propagated signal by reducing resistance in the conduction path.

Many modifications and other aspects of the disclosures set forth herein will come to mind to one skilled in the art to which these disclosures pertain having the benefit of the teachings presented in the foregoing descriptions and the associated drawings. For example, the exemplary methods and aspects thereof as disclosed herein are discussed with respect to, for instance, full-wafer semiconductor processing and wafer-to-wafer bonding of the support member. However, one skilled in the art will appreciate that such methods and aspects thereof may also be applicable in other processes such as, for example, die-to-wafer or die-to-die bonding processes, for bonding the support member to device substrates, or for bonding the support member to redistribution substrates or IC substrates. Therefore, it is to be understood that the disclosures are not to be limited to the specific aspects disclosed and that modifications and other aspects are intended to be included within the scope of the appended claims. Although specific terms are employed herein, they are used in a generic and descriptive sense only and not for purposes of limitation.

That which is claimed:

1. A piezoelectric ultrasonic transducer apparatus, comprising:
    a transducer device disposed on a dielectric layer disposed on a device substrate, the device substrate comprising one of a silicon-on-insulator substrate and a silicon substrate, the transducer device including a first electrode disposed on the dielectric layer and a piezoelectric material disposed between the first electrode and a second electrode, the piezoelectric material having a maximum lateral dimension greater than a thickness thereof, the device substrate and the dielectric layer being configured to define a first via extending therethrough to the first electrode;
    a first conductive material configured to substantially fill the first via; and
    a support member engaged with the device substrate and forming a sidewall defining a second via extending to and exposing the device substrate and the first conductive material, the exposed device substrate further defining a second via end wall, and the first conductive material being disposed with respect to the second via end wall away from the sidewall.

2. An apparatus according to claim 1, wherein the first conductive material is medially disposed with respect to the second via end wall away from the sidewall.

3. An apparatus according to claim 1, further comprising a second conductive material disposed on the support member, the device substrate, and the first conductive material defining the second via, the second conductive material forming an electrically-conductive engagement with the first conductive material.

4. An apparatus according to claim 3, wherein the second conductive material is configured to extend outwardly of the second via, the second conductive material thereby being adapted to form an electrically-conductive engagement with an external device.

5. An apparatus according to claim 1, further comprising an insulator material disposed between the support substrate and the second conductive material, the insulator material extending into the second via to the device substrate.

6. An apparatus according to claim 1, wherein the device substrate further defines an isolation via extending therethrough to the dielectric layer, the isolation via being laterally disposed between adjacent transducer devices so as to at least one of electrically isolate and acoustically isolate the adjacent transducer devices from each other.

7. An apparatus according to claim 6, further comprising a dielectric material deposited within the isolation via.

8. An apparatus according to claim 1, wherein the piezoelectric material is configured such that the first electrode extends laterally outward thereof, and wherein an interlayer dielectric material is deposited on the first electrode, prior to the second electrode being deposited on the piezoelectric material and the interlayer dielectric material, such that at least a portion of the interlayer dielectric material is disposed between the first and second electrodes.

* * * * *